US007022615B2

(12) United States Patent
Okumura et al.

(10) Patent No.: US 7,022,615 B2
(45) Date of Patent: Apr. 4, 2006

(54) PLASMA PROCESSING METHOD

(75) Inventors: Tomohiro Okumura, Kadoma (JP); Mitsuo Saitoh, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 301 days.

(21) Appl. No.: 10/720,092

(22) Filed: Nov. 25, 2003

(65) Prior Publication Data

US 2004/0157447 A1 Aug. 12, 2004

(30) Foreign Application Priority Data

Nov. 26, 2002 (JP) ............................ 2002-342006

(51) Int. Cl.
*H01L 21/302* (2006.01)

(52) U.S. Cl. ...................................... 438/710; 438/714

(58) Field of Classification Search ................ 438/706, 438/710, 714, 719–725, 729
See application file for complete search history.

(56) References Cited

U.S. PATENT DOCUMENTS

| | | | | |
|---|---|---|---|---|
| 5,824,455 | A * | 10/1998 | Komatsu et al. ............ | 430/323 |
| 5,981,001 | A * | 11/1999 | Komatsu et al. ............ | 427/582 |
| 6,025,115 | A * | 2/2000 | Komatsu et al. ............ | 430/313 |
| 6,506,665 | B1 * | 1/2003 | Sato ........................... | 438/458 |
| 6,743,727 | B1 * | 6/2004 | Mathad et al. .............. | 438/695 |

FOREIGN PATENT DOCUMENTS

| | | |
|---|---|---|
| JP | 2004-146773 | 5/2004 |

* cited by examiner

*Primary Examiner*—Kin-Chan Chen
(74) *Attorney, Agent, or Firm*—Wenderoth, Lind & Ponack, L.L.P.

(57) ABSTRACT

A plasma processing method for processing a surface of an object to be processed made of a metal or a semiconductor by applying activated particles generated by a microplasma generated at a pressure of not lower than 10,000 Pa and not higher than three atmospheric pressures to the surface of the object, the method includes removing a natural oxide film on the surface of the object, and etching a part or whole of a region in which the natural oxide film has been removed.

11 Claims, 11 Drawing Sheets

PLASMA PROCESSING METHOD

BACKGROUND OF THE INVENTION

The present invention relates to a plasma processing method of a minute portion.

In general, when an object to be processed represented by a substrate on the surface of which a thin film is formed is subjected to a patterning process, a resist process is used. One example of the process is shown in FIGS. 9A through 9D. In FIGS. 9A through 9D, first of all, a photosensitive resist 34 is coated on the surface of an object 33 to be processed (FIG. 9A). Next, by carrying out exposure by means of an exposure apparatus and thereafter carrying out development, the resist 34 can be patterned into the desired shape (FIG. 9B). Then, by placing the object 33 to be processed in a vacuum vessel, generating a plasma in the vacuum vessel and subjecting the object 33 to be processed to an etching process using the resist 34 as a mask, the surface of the object 33 to be processed is patterned into the desired shape (FIG. 9C). Finally, by removing the resist 34 by means of an oxygen plasma, an organic solvent, or the like, the processing is completed (FIG. 9D).

The aforementioned resist process, which has been suitable for accurately forming a minute pattern, has come to play an important role in manufacturing electronic devices such as semiconductors. However, there is a drawback that the process is complicated.

Accordingly, there is examined a new processing method that uses no resist process. As one example, there is being proposed a plasma processing apparatus equipped with a microplasma source 99 as shown in FIG. 16. The construction is proposed in detail in, for example, the first patent reference of the company's own application that has been published as Japanese Unexamined Patent Publication No. 2004-146773 which was filed as claiming priority of Japanese Patent Application No. 2002-254324.

However, in the plasma processing proposed as above, if a high-frequency power is increased to increase an etching rate, arc discharge (spark) is generated on the surface of the thin plate as the object to be processed, and this leads to an issue that no smooth processed surface can be obtained and neither stability nor reproducibility of processing can be obtained.

SUMMARY OF THE INVENTION

In view of the aforementioned issues, the present invention has an object of providing a plasma processing method, which is simple and able to accurately process the desired minute portion.

In accomplishing the aforementioned object, the present invention is constructed as follows.

According to a first aspect of the present invention, there is provided a plasma processing method for processing a surface of an object to be processed made of a metal or a semiconductor by applying activated particles generated by a microplasma generated at a pressure of not lower than 10,000 Pa and not higher than three atmospheric pressures to the surface of the object, the method comprising:

removing a natural oxide film on the surface of the object; and etching a part or whole of a region in which the natural oxide film has been removed.

According to a second aspect of the present invention, there is provided the plasma processing method as defined in the first aspect, wherein the microplasma is generated by supplying an electric power to an electrode provided at a microplasma source arranged in a neighborhood of the object or the object while supplying gas to the microplasma source when carrying out the film removing and the region processing, and the generated activated particles are made to act on the object so as to process the surface of the object, the natural oxide film is removed by applying the activated particles to a first portion of the surface of the object in the film removing, and an etching is carried out by applying activated particles to a second portion that is included in the first portion of the surface of the object and is narrower than the first portion in the region processing.

According to a third aspect of the present invention, there is provided the plasma processing method as defined in the second aspect, wherein with the microplasma source having an inner gas outlet and an outer gas outlet, gas mainly comprised of inert gas is issued from the inner gas outlet and gas mainly comprised of inert gas is issued from the outer gas outlet in applying the activated particles to the first portion, and gas mainly comprised of inert gas is issued from the inner gas outlet and gas mainly comprised of reactive gas is issued from the outer gas outlet in applying the activated particles to the second portion.

According to a fourth aspect of the present invention, there is provided the plasma processing method as defined in the second aspect, wherein with the microplasma source having an inner gas outlet and an outer gas outlet, gas mainly comprised of inert gas is issued from the inner gas outlet and no gas is issued from the outer gas outlet in applying the activated particles to the first portion, and gas mainly comprised of inert gas is issued from the inner gas outlet and gas mainly comprised of reactive gas is issued from the outer gas outlet in applying the activated particles to the second portion.

According to a fifth aspect of the present invention, there is provided the plasma processing method as defined in the second aspect, wherein with the microplasma source having an inner gas outlet and an outer gas outlet, gas mainly comprised of inert gas is issued from the inner gas outlet and gas mainly comprised of reactive gas is issued from the outer gas outlet in applying the activated particles to the first portion, and gas mainly comprised of inert gas is issued from the inner gas outlet and gas mainly comprised of reactive gas is issued from the outer gas outlet in applying the activated particles to the second portion by a quantity several times to several tens of times larger than in applying the activated particles to the first portion.

According to a sixth aspect of the present invention, there is provided the plasma processing method as defined in the first aspect, wherein the microplasma is generated by supplying an electric power to an electrode provided at a microplasma source arranged in a neighborhood of the object or the object while supplying gas to the microplasma source when carrying out the film removing and the region processing, and the generated activated particles are made act on the object so as to process the surface of the object, the natural oxide film is removed by applying activated particles that have reducibility, to the surface of the object in the film removing, and an etching is carried out by applying in the region processing activated particles that have etchability, to the surface of the object to which the activated particles that have reducibility have been applied, in the region processing.

According to a seventh aspect of the present invention, there is provided the plasma processing method as defined in the sixth aspect, wherein the activated particles are applied to the first portion of the surface of the object in the film removing, and the activated particles are applies to a second portion that is included in the first portion and is narrower than the first portion in the region processing.

According to an eighth aspect of the present invention, there is provided the plasma processing method as defined in the seventh aspect, wherein with the microplasma source having an inner gas outlet and an outer gas outlet, gas mainly comprised of inert gas is issued from the inner gas outlet and gas mainly comprised of inert gas is issued from the outer gas outlet while reducing gas is mixed with the gas issued from the inner gas outlet or the outer gas outlet, in applying the activated particles to the first portion, and gas mainly comprised of inert gas is issued from the inner gas outlet and gas mainly comprised of etching gas is issued from the outer gas outlet in applying the activated particles to the second portion.

According to a ninth aspect of the present invention, there is provided the plasma processing method as defined in the seventh aspect, wherein with the microplasma source having an inner gas outlet and an outer gas outlet, a mixed gas of inert gas and reducing gas is issued from the inner gas outlet and no gas is issued from the outer gas outlet in applying the activated particles to the first portion, and gas mainly comprised of inert gas is issued from the inner gas outlet and gas mainly comprised of etching gas is issued from the outer gas outlet in applying the activated particles to the second portion.

According to a 10th aspect of the present invention, there is provided the plasma processing method as defined in the seventh aspect, wherein with the microplasma source having an inner gas outlet and an outer gas outlet, a mixed gas of inert gas and reducing gas is issued from the inner gas outlet and gas mainly comprised of etching gas is issued from the outer gas outlet in applying the activated particles to the first portion, and gas mainly comprised of inert gas is issued from the inner gas outlet, and gas mainly comprised of etching gas is issued from the outer gas outlet by a quantity larger than in applying the activated particles to the first portion, in applying the activated particles to the second portion.

According to an 11th aspect of the present invention, there is provided the plasma processing method as defined in the first aspect, wherein the microplasma is generated by supplying an electric power to an electrode provided at a microplasma source arranged in a neighborhood of the object or the object while supplying gas to the microplasma source when carrying out the film removing and the region processing and making the generated activated particles act on the object so as to process the surface of the object, the method comprising:

the natural oxide film on the surface of the object is removed by supplying a first electric power to the electrode provided at the microplasma source or the object in the film removing; and the part or whole of the region in which the natural oxide film on the surface of the object has been removed is etched by supplying a second electric power that is greater than the first electric power to the electrode provided at the microplasma source or the object in the region processing.

According to the plasma processing method of a first aspect of the present invention, the construction is simple, and the desired minute portion can be accurately processed.

According to the plasma processing method of a second aspect of the present invention, a plasma processing method, which is simple and able to accurately process the desired minute portion, can be provided.

Furthermore, according to a sixth aspect of the present invention, the construction is simple, and the desired minute portion can be accurately processed.

Furthermore, according to an eleventh aspect of the present invention, the construction is simple, and the desired minute portion can be accurately processed.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1A:
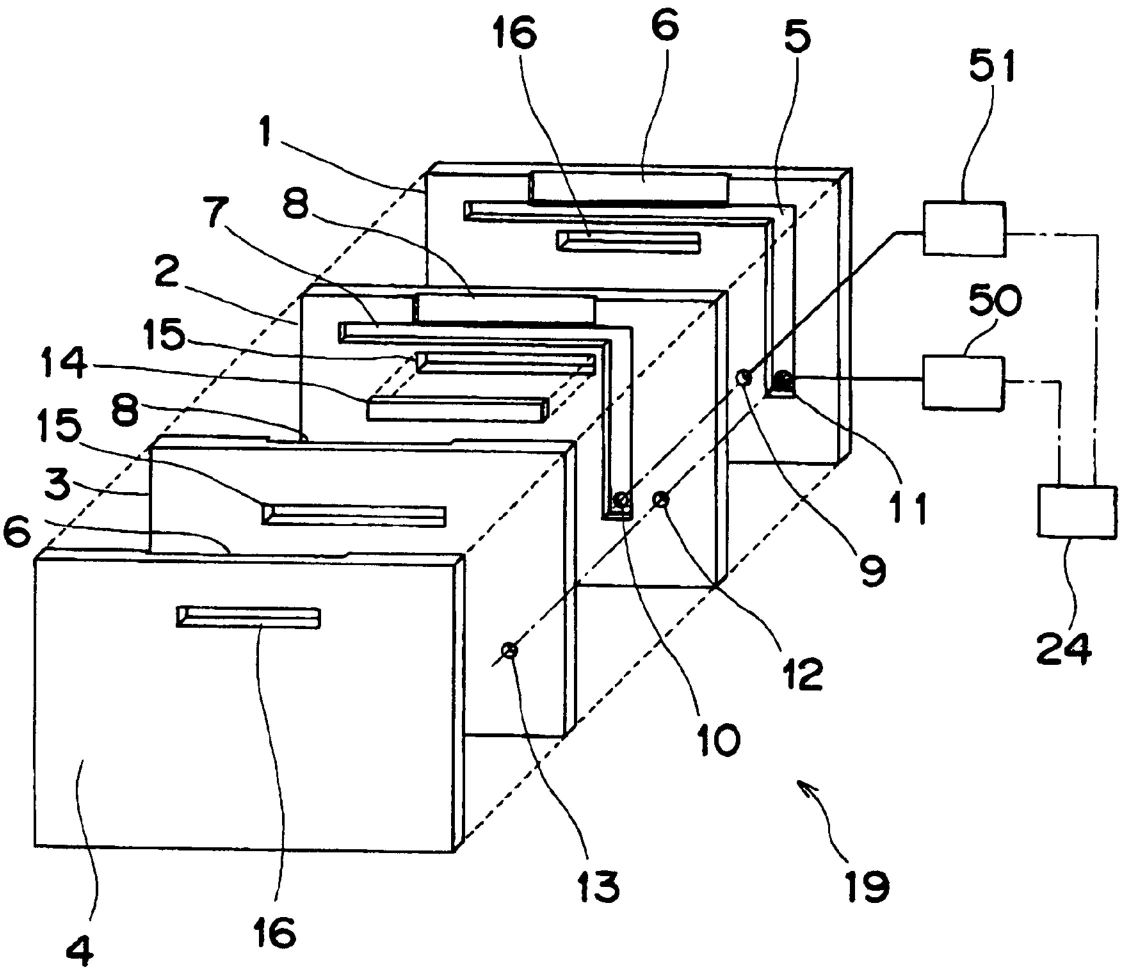
FIG. 1A is an exploded view of a microplasma source used by a plasma processing method of a first embodiment of the present invention.

Before the description of the present invention proceeds, it is to be noted that like parts are designated by like reference numerals throughout the accompanying drawings.

Embodiments of the present invention will be described in detail below with reference to the drawings.

First Embodiment

The plasma processing method and apparatus of the first embodiment of the present invention will be described below with reference to FIGS. 1A through 5.

Figure 1B:
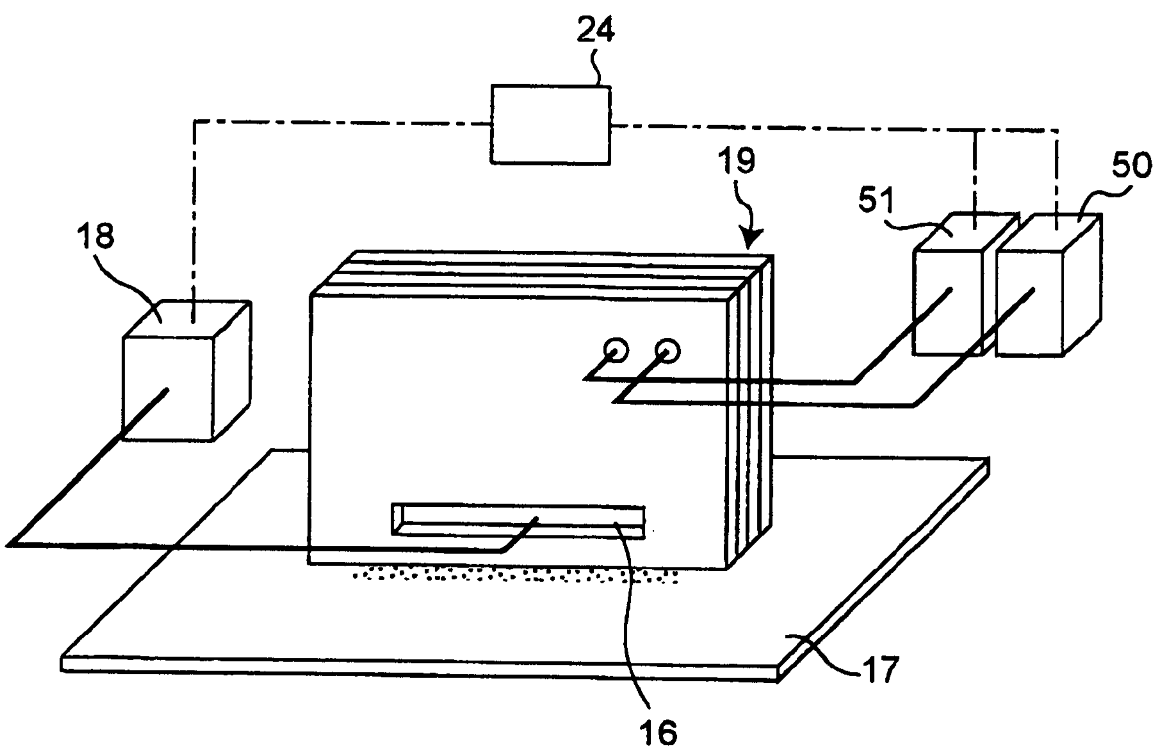
FIG. 1B is a perspective view of a plasma processing apparatus used by the plasma processing method of the first embodiment of the present invention.
Figure 2:
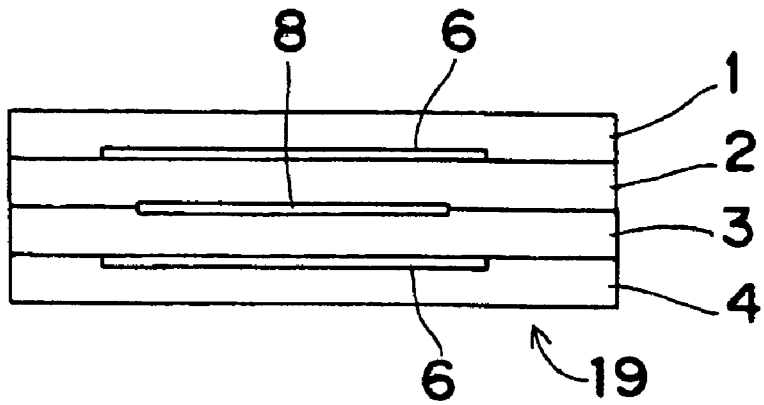
FIG. 2 is a plan view of the microplasma source used by the plasma processing method of the first embodiment of the present invention.
Figure 3:
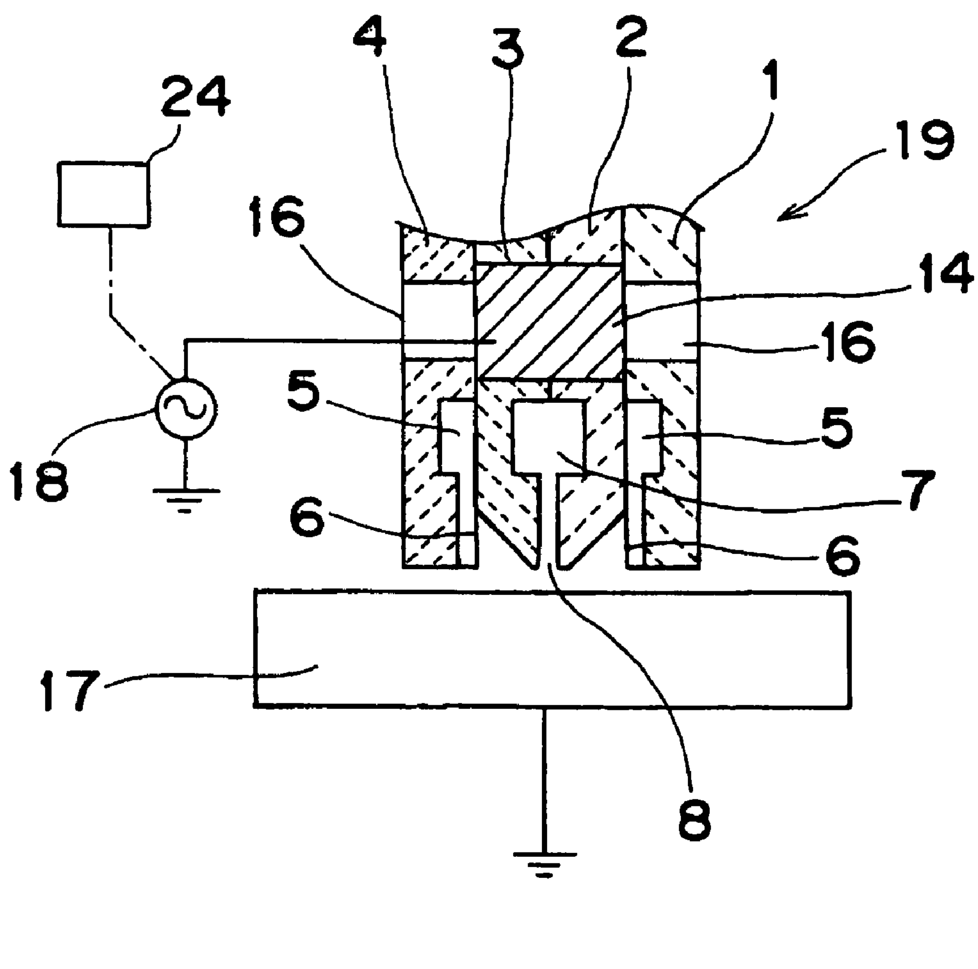
FIG. 3 is a sectional view of the microplasma source used by the plasma processing method of the first embodiment of the present invention.

FIGS. 1A and 1B show exploded views of a microplasma source 19 elongated sideways in a to-be-formed linear direction of the plasma processing apparatus of the first embodiment. FIG. 2 shows a plan view of the microplasma source 19 viewed from the gas outlet side. FIG. 3 shows a cross section of a thin plate 17 as one example of the grounded object to be processed and the microplasma source, taken along a plane perpendicular to the thin plate 17. The microplasma source 19 is constructed of a rectangular outside plate 1, rectangular inside plates 2 and 3, and a rectangular outside plate 4, which are made of ceramics. The outside plates 1 and 4 are provided with an L-figured outside gas passage 5 and a rectangular outer gas outlet 6, respectively, while the inside plates 2 and 3 are provided with an L-figured inside gas passage 7 and a rectangular inner gas outlet 8, respectively. That is, the outside plate 1, the inside plates 2 and 3, and the outside plate 4 are provided, the outer gas outlets 6 are provided between the outside plate 1 and the inside plate 2 and between the inside plate 3 and the outside plate 4, and the inner gas outlet 8 is provided between the inside plates 2 and 3. The material gas of the gas issued from the inner gas outlet 8 is guided from an inside gas supply port 9, which is provided at the outside plate 1 and connected to an external inside gas supply unit 51, via a through hole 10 provided at the inside plate 2 to the inside gas passage 7 of the inside plate 2 and the inside gas passage 7 of the inside plate 3 opposed to the inside gas passage 7 of the inside plate 2.

Moreover, the material gas issued from the outer gas outlet 6 is guided from an outside gas supply port 11, which is provided at the outside plate 1 and connected to an external outside gas supply unit 50, to the outside gas passage 5 of the outside plate 1 while being guided to the outside gas passage 5 of the outside plate 4 via a through hole 12 provided at the inside plate 2 and a through hole 13 provided at the inside plate 3. The inside gas supply unit 51 and the outside gas supply unit 50 are operatively controlled by a control unit 24 described later.

The sideways elongated rectangular electrode 14 to which a high-frequency power is applied is inserted in a sideways elongated rectangular electrode fixation slot 15 provided at the inside plates 2 and 3, and wiring to a power supply 18 for high-frequency power supply and cooling provided and effected through sideways elongated rectangular through holes 16 provided at the outside plates 1 and 4. The power supply 18 for high-frequency power supply is operatively controlled by the control unit 24 described later.

The inside plates 2 and 3 have their lowermost portions tapered to enable the plasma processing of a minuter linear region. It is to be noted that a fine line formed of the inner gas outlet 8 as an opening of the microplasma source has a thickness of 0.1 mm.

In the plasma processing apparatus equipped with the microplasma source 19 of the aforementioned construction, by supplying the high-frequency power to the electrode 14 while supplying helium (He) from the inner gas outlet 8 and a sulfur hexafluoride ($SF_6$) from the outer gas outlet 6, a minute linear portion of the silicon thin plate 17 can be etched. The reason for the above is that a linear microplasma can be generated only in the neighborhood of the inner gas outlet 8 where a helium concentration becomes high taking advantage of a difference in readiness for electric discharge at a pressure around the atmospheric pressure between helium and sulfur hexafluoride (helium is more prone to electric discharge).

The microplasma source 19, which can operate from several Pascals to several atmospheric pressures, operates typically at a pressure within a range of about 10000 Pa to three atmospheric pressures. In particular, operation at and around the atmospheric pressure is especially preferable since neither strict sealed structure nor special exhaust device is necessary and the diffusion of plasmas and activated particles is moderately restrained.

Figure 1C:
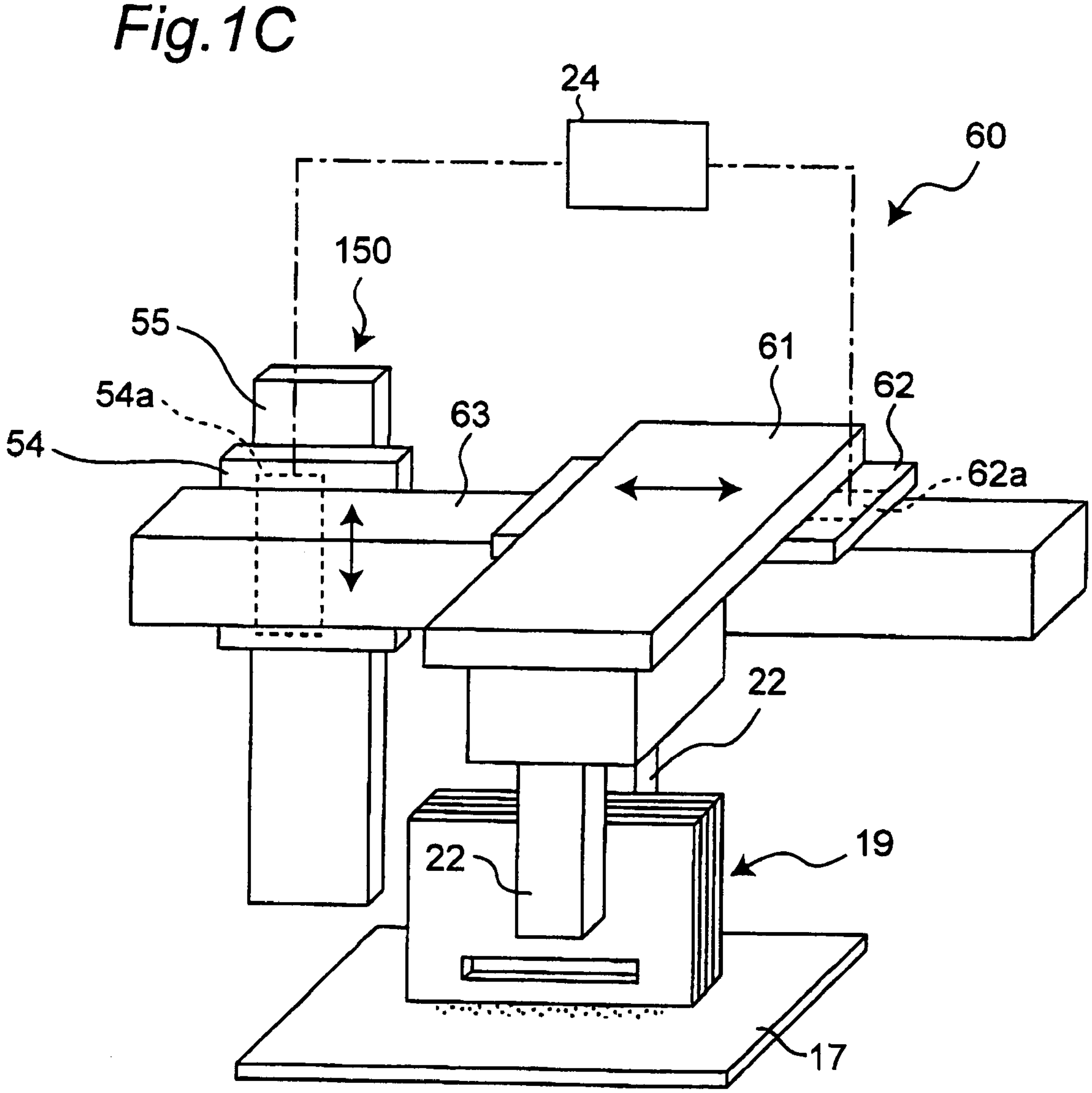
FIG. 1C is a perspective view of the overall construction of the plasma processing apparatus used by the plasma processing method of the first embodiment of the present invention.

FIG. 1C shows one example of a transport unit 60 of the aforementioned plasma processing apparatus. The transport unit 60 is constructed of a bracket 61 to which a pair of brackets 22 and 22 that hold the microplasma source 19 therebetween are fixed, a rail 63 extended along the direction of movement (linear direction of the minute linear region) of the transport unit 60, and a moving stage 62, to which the bracket 61 is fixed and which moves the bracket 61 along the rail 63 to which a screw shaft engaged with a motor 62*a* is fixed by forwardly and reversely rotating a transport drive motor 62*a* provided as one example of the transport drive unit. Therefore, the moving stage 62 advances along the rail 63 by forwardly rotating the transport drive motor 62*a* under the control of the control unit 24 to move the microplasma source 19 relative to the silicon thin plate 17 via the bracket 61, thereby allowing a microplasma 118 to move along the silicon thin plate 17 for the achievement of plasma processing with a minute linear region processed on the silicon thin plate 17.

An elevation unit 150 is constructed of a rail 55, which is extended in the vertical direction and of which the screw shaft is fixed, and a moving stage 54, to which the rail 63 of the transport unit 60 is fixed and which moves up and down the rail 63 along the rail 55 to which the screw shaft engaged with an elevation drive motor 54*a* is fixed by forwardly and reversely rotating the motor 54*a* provided as one example of the elevation drive unit connected to the control unit 24.

Therefore, by the elevating operation of the moving stage 54 along the rail 55 with the elevation drive motor 54*a* forwardly and reversely rotated under the control of the control unit 24, the microplasma source 19 can be put close to or apart from the silicon thin plate 17 via the rail 63 and the bracket 61, so that a distance between the microplasma source 19 and the silicon thin plate 17 can be adjusted.

Concrete operation of the plasma processing method of the first embodiment is as follows.

Figure 4:
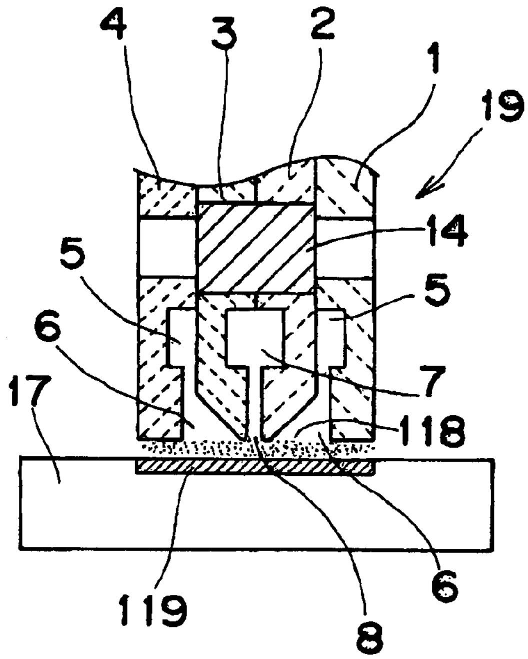
FIG. 4 is a sectional view of the microplasma source used by the plasma processing method of the first embodiment of the present invention.

First of all, in a first step, by supplying He as one example of inert gas from the inner gas outlet 8 via the inside gas passage 7 from the inside gas supply unit 51 by 1000 sccm, supplying He as one example of inert gas from the outer gas outlet 6 via the outside gas passage 5 from the outside gas supply unit 50 by 500 sccm, and supplying a high-frequency power of 150 W as one example from the high-frequency power source 18 to the electrode 14, a microplasma 118 is generated as shown in FIG. 4, and helium ions as one example of generated activated particles are applied (irradiated) to a first minute portion 119 as shown in FIG. 4 for five seconds as one example.

Figure 5:
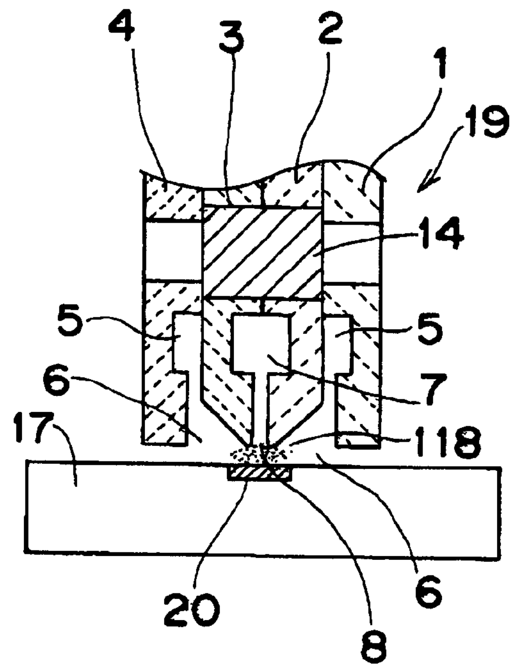
FIG. 5 is a sectional view of the microplasma source used by the plasma processing method of the first embodiment of the present invention.

Subsequently, in a second step, by supplying He as one example of inert gas from the inner gas outlet 8 via the inside gas passage 7 from the inside gas supply unit 51 by 1000 sccm, supplying $SF_6$ as one example of the reactive gas from the outer gas outlet 6 via the outside gas passage 5 from the outside gas supply unit 50 by 500 sccm, and supplying a high-frequency power of 150 W as one example from the high-frequency power source 18 to the electrode 14 with the plasma 118 maintained, a microplasma 118 is formed as shown in FIG. 5, and fluorine radicals as one example of generated activated particles are applied (irradiated) to a second minute portion 20 as shown in FIG. 5 for 30 seconds as one example. As is apparent from FIGS. 4 and 5, the second minute portion 20 is a region narrower than the first minute portion 119, and its line width is 0.3 mm as one example.

When carrying out the processing as described above, the etching process of a fine line of a line width of 0.3 mm can be achieved on the minute portion of the surface of the silicon thin plate 17 as one example of the object to be processed. The etching depth is 21 μm.

For the sake of comparison, as a conventional processing method, He was supplied by 1000 sccm from the inner gas outlet 8 via the inside gas passage 7, $SF_6$ was supplied by 500 sccm from the outer gas outlet 6 via the outside gas passage 5, and a high-frequency power of 150 W as one example was supplied to the electrode 14 without carrying out the aforementioned first step. As a result, arc discharge (spark) occurred on the surface of the thin plate 17 as one example of the object to be processed, as a consequence of which no smooth processed surface was able to be obtained, and neither stability nor reproducibility of processing was obtained.

The reason for the occurrence of the aforementioned difference will be described in detail below.

Figure 10:
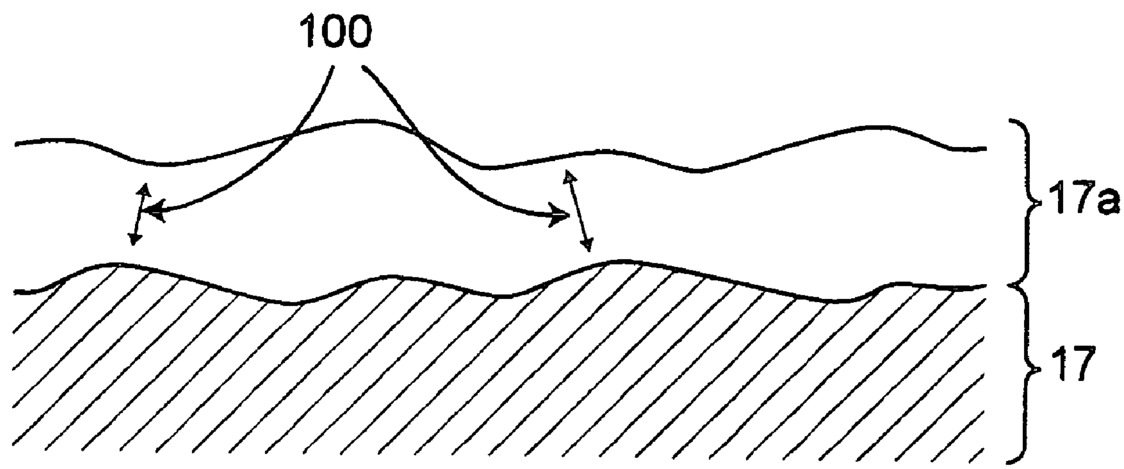
FIG. 10 is a sectional view showing a state in which a silicon oxide film of a natural oxide film is formed on a surface of a silicon thin plate.

A silicon oxide film (natural oxide film) 17*a* of a very small thickness (thickness is not greater than 1 nm) is formed on the surface of the silicon thin plate 17 as shown in FIG. 10. In general, natural oxide films are formed on the surfaces of metals, this being not limited to silicon. The natural oxide film is formed not completely uniformly, and therefore, it can be considered that there are existing a portion where a current easily flows (portion where the film thickness of the natural oxide film is thin) 100 and a portion where a current hardly flows, in mixture.

Figure 11:
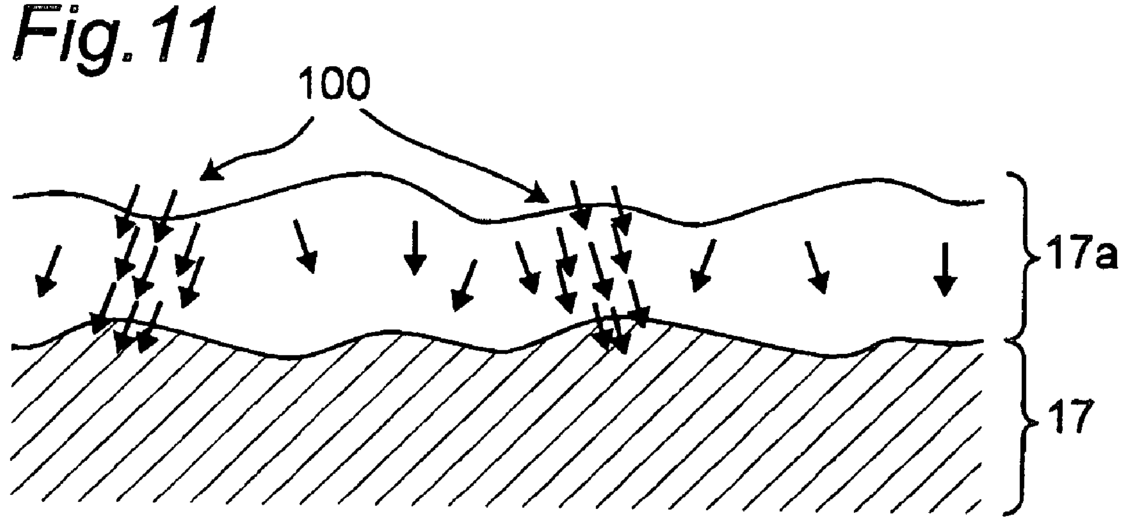
FIG. 11 is a sectional view showing a state in which arc discharge is generated as a consequence of the application (irradiation) of a microplasma to the surface of the silicon thin plate of FIG. 10, concentration of a high-frequency current from the plasma on a portion in which a current easily flows, and abrupt local temperature rise in the portion.

It could be considered that, when a microplasma was applied to the minute portion (the region of about the same size as that of the second minute portion 20 of the present invention) by the conventional processing method, a high-frequency current from the plasma was concentrated on the portion 100 where a current easily flowed as shown in FIG. 11, and the temperature in the portion 100 was locally suddenly increased, ending in the occurrence of arc discharge (spark).

Figure 12:
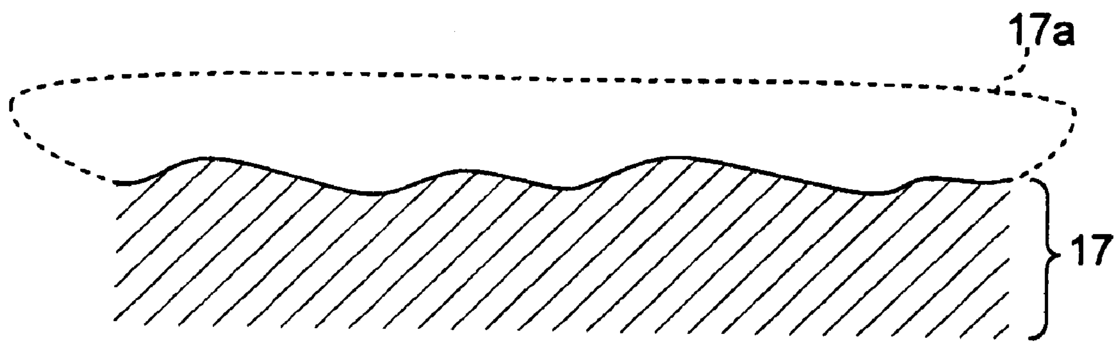
FIG. 12 is a sectional view showing a state in which the natural oxide film on the surface of the silicon thin plate is removed by the plasma processing method of the above-mentioned embodiment of the present invention.
Figure 13:
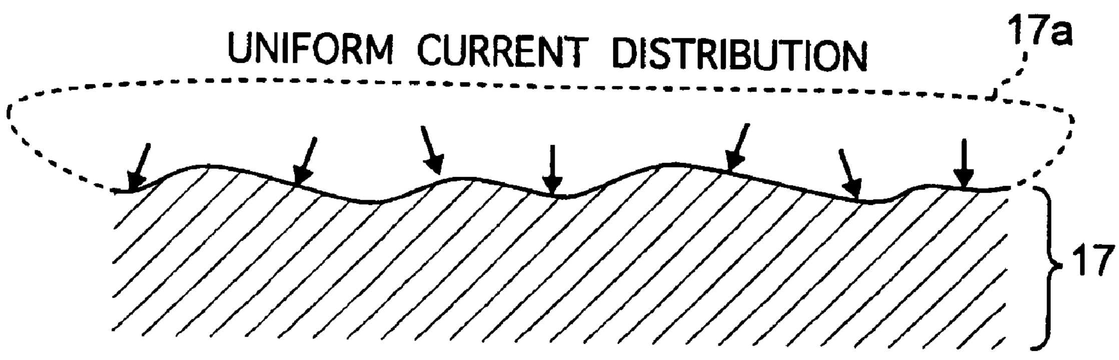
FIG. 13 is a sectional view showing a state in which no arc discharge (spark) occurs as a consequence of the occurrence of no local temperature rise due to a small difference between a portion where a current easily flows and a portion where a current hardly flows and a roughly uniform flow of current in a second minute portion because of the disappearance of the natural oxide film even if a microplasma is applied to the silicon thin plate of FIG. 12.

On the other hand, according to the plasma processing method of the first embodiment of the present invention, by applying a plasma to the comparatively wide first minute portion 119 in the first step, the natural oxide film 17*a* on the surface of the thin plate 17 can be removed by plasma irradiation of a low current density as shown in FIG. 12. Next, the processing is shifted to the second step with the plasma maintained. It could be considered that there was a small difference between the portion where a current easily flowed and the portion where a current hardly flowed due to the disappearance of the natural oxide film, despite the execution of plasma irradiation of a totally higher current density in the second step than in the first step, and an almost uniform current flowed in the second minute portion 20 as shown in FIG. 13, therefore causing neither local temperature rise nor the consequent occurrence of arc discharge (spark).

In order to further substantiate the aforementioned mechanism, it was examined whether or not arc discharge occurred in the second step by making the plasma disappear with the supply of electric power once stopped after the end of the first step and carrying out the second step after a lapse of a specified time. No arc discharge occurred when the stop time was one second to six seconds, and the occurrence of arc discharge was able to be confirmed when the plasma was stopped for seven or more seconds.

This is considered to mean that, although the natural oxide film is removed once in the first step, a natural oxide film is disadvantageously formed again on the silicon thin plate 17 by the surface left for seven or more seconds. This experiment teaches that the plasma preferably is not made to disappear between the first step and the second step in order to prevent the occurrence of arc discharge, and, if the plasma is once made to disappear, the time is limited to a short time of several seconds or, for example, not longer than six seconds.

The area of the second minute portion 20 preferably is about 1/1000 to 1/5 of the area of the first minute portion 119. The area more preferably is 1/1000 to 1/10. If the area of the second minute portion 20 is extremely smaller than the area of the first minute portion 119, then a large portion of the electric power in the first step becomes wasteful to a disadvantage. Moreover, only with the arrangement that the area of the second minute portion 20 is slightly smaller than the area of the first minute portion 119, the occurrence of arc discharge cannot sufficiently be restrained.

As a concrete example, the width of the first minute portion 119 preferably is five to one thousand times the width of the second minute portion 20 when the width of the second minute portion 20 is 100 μm to 1 mm.

Second Embodiment

The second embodiment of the present invention will be described next with reference to FIGS. 1A through 3 and FIGS. 5 and 6. It is to be noted that the basic construction and operation of the microplasma source shown in FIGS. 1A through 3 have already been described in connection with the first embodiment, no detail is herein provided therefor.

Figure 6:
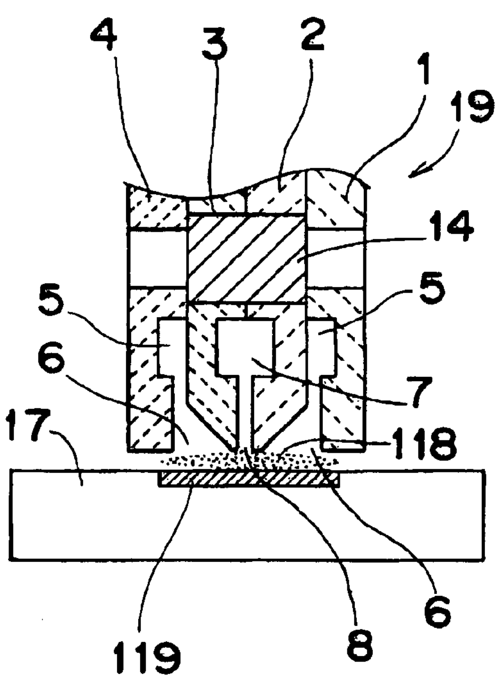
FIG. 6 is a sectional view of a microplasma source used by a plasma processing method of a second embodiment of the present invention.

First of all, in the first step, by supplying He as one example of inert gas from the inner gas outlet 8 via the inside gas passage 7 from the inside gas supply unit 51 by 1000 sccm and supplying a high-frequency power of 150 W as one example from the high-frequency power source 18 to the electrode 14 with no gas issued from the outer gas outlet 6, a microplasma 118 is generated as shown in FIG. 6, and helium ions as one example of generated activated particles are applied to a first minute portion 119 as shown in FIG. 6 for five seconds as one example.

Next, in the second step, by supplying He as one example of inert gas from the inner gas outlet 8 via the inside gas passage 7 from the inside gas supply unit 51 by 1000 sccm, supplying $SF_6$ as one example of the reactive gas from the outer gas outlet 6 via the outside gas passage 5 from the outside gas supply unit 50 by 500 sccm, and supplying a high-frequency power of 150 W as one example from the high-frequency power source 18 to the electrode 14 with the plasma 118 maintained, a microplasma 118 is formed as shown in FIG. 5, and fluorine radicals as one example of generated activated particles are applied to a second minute portion 20 as shown in FIG. 5 for 30 seconds as one example. As is apparent from FIGS. 5 and 6, the second minute portion 20 is a region narrower than the first minute portion 119, and its line width is 0.3 mm as one example.

As a result of carrying out the processing as described above, the minute portion on the surface of the silicon thin plate 17 as one example of the object to be processed can be subjected to the fine line etching process of a line width of 0.3 mm. The etching depth is 21 μm. The reason of the nonoccurrence of arc discharge (spark) is considered to be ascribed to the reason described in connection with the first embodiment of the present invention.

The area of the second minute portion 20 preferably is about 1/1000 to 1/5 of the area of the first minute portion 119. The area more preferably is 1/1000 to 1/10. If the area of the second minute portion 20 is extremely smaller than the area of the first minute portion 119, then a large portion of the electric power in the first step becomes wasteful to a disadvantage. Moreover, only with the arrangement that the area of the second minute portion 20 is slightly smaller than the area of the first minute portion 119, the occurrence of arc discharge cannot sufficiently be restrained.

Third Embodiment

The third embodiment of the present invention will be described next with reference to FIGS. 1A through 3 and FIGS. 5 and 7. It is to be noted that the basic construction and operation of the microplasma source shown in FIGS. 1A through 3 have already been described in connection with the first embodiment, no detail is herein provided therefor.

Figure 7:
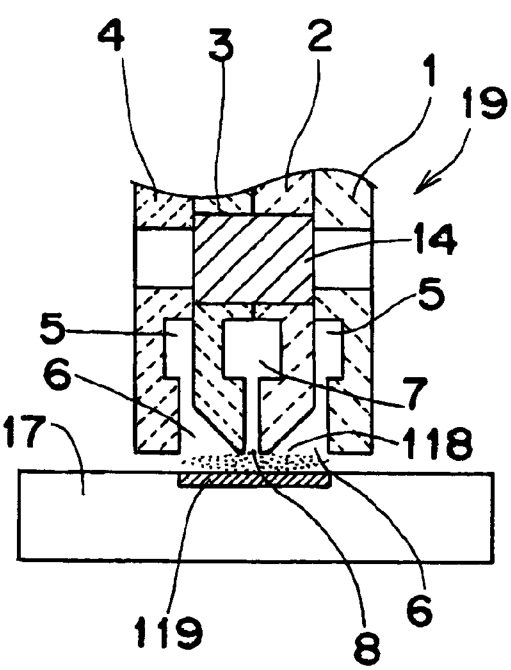
FIG. 7 is a sectional view of a microplasma source used by a plasma processing method of a third embodiment of the present invention.

First of all, in the first step, by supplying He as one example of inert gas from the inner gas outlet 8 via the inside gas passage 7 from the inside gas supply unit 51 by 1000 sccm, supplying $SF_6$ as one example of reactive gas from the outer gas outlet 6 from the outside gas supply unit 50 by 500 sccm, and supplying a high-frequency power of 150 W as one example from the high-frequency power source 18 to the electrode 14, a microplasma 118 is generated as shown in FIG. 7, and helium ions as one example of generated activated particles are applied to a first minute portion 119 as shown in FIG. 7 for five seconds as one example.

Next, in the second step, by supplying He as one example of inert gas from the inner gas outlet 8 via the inside gas passage 7 from the inside gas supply unit 51 by 1000 scam, supplying $SF_6$ as one example of reactive gas from the outer gas outlet 6 via the outside gas passage 5 from the outside gas supply unit 50 by, for example, 500 scam, which is several times to several tens of times greater than in the first step, and supplying a high-frequency power of 150 W as one example from the high-frequency power source 18 to the electrode 14 with the plasma maintained, a microplasma 118 is formed as shown in FIG. 5, and fluorine radicals as one example of generated activated particles are applied to a second minute portion 20 as shown in FIG. 5 for 30 seconds as one example. As is apparent from FIGS. 5 and 7, the second minute portion 20 is a region narrower than the first minute portion 119, and its line width is 0.3 mm as one example.

As a result of carrying out the processing as described above, the minute portion on the surface of the silicon thin plate 17 as one example of the object to be processed can be subjected to the fine line etching process of a line width of 0.3 mm. The etching depth is 21 μm. The reason of the nonoccurrence of arc discharge (spark) is considered to be ascribed to the reason described in connection with the first embodiment of the present invention.

In this third embodiment, the region where the microplasma is generated in the first step is widened by making the reactive gas issued from the outer gas outlet 6 in the first step extremely smaller than that in the second step. The reactive gas issued from the outer gas outlet 6 in the first step preferably is about 1/100 to 1/5 and more preferably is 1/100 to 1/10 of the reactive gas issued from the outer gas outlet 6 in the second step. If the reactive gas issued from the outer gas outlet 6 in the first step is made extremely smaller than in (i.e. less than 1/100 of) the second step, then it disadvantageously becomes difficult to control the gas flow rate by using an identical gas flow rate adjustment unit. Moreover, if the reactive gas issued from the outer gas outlet 6 in the first step is made slightly smaller than in (i.e. less than 1/1 and more than 1/5 of) the second step, the spreading of the plasma in the first step becomes insufficient, and there is a concern about the occurrence of arc discharge.

The area of the second minute portion 20 preferably is about 1/1000 to 1/5 of the area of the first minute portion 119. The area more preferably is 1/1000 to 1/10. If the area of the second minute portion 20 is extremely smaller than (i.e. less than 1/1000 of) the area of the first minute portion 119, then a large portion of the electric power in the first step becomes wasteful to a disadvantage. Moreover, only with the arrangement that the area of the second minute portion 20 is slightly smaller than (i.e. less than 1/1 and more than 1/5 of) the area of the first minute portion 119, the occurrence of arc discharge cannot sufficiently be restrained.

Fourth Embodiment

The fourth embodiment of the present invention will be described next with reference to FIGS. 1A through 3. It is to be noted that the basic construction and operation of the microplasma source shown in FIGS. 1A through 3 have been described in connection with the first embodiment, no detail is herein provided therefor.

First of all, in the first step, by supplying He as one example of inert gas by 1000 sccm and hydrogen ($H_2$) as one example of reducing gas by one sccm from the inner gas outlet 8 via the inside gas passage 7 from the inside gas supply unit 51, supplying He as one example of inert gas from the outer gas outlet 6 via the outside gas passage 5 from the outside gas supply unit 50 by 500 sccm, and supplying a high-frequency power of 150 W as one example from the high-frequency power source 18 to the electrode 14, a microplasma is generated, and helium ions and hydrogen radicals as one example of generated activated particles are applied to a first minute portion for two seconds as one example.

Next, in the second step, by supplying He as one example of inert gas from the inner gas outlet 8 via the inside gas passage 7 from the inside gas supply unit 51 by 1000 sccm, supplying $SF_6$ as one example of etching gas from the outer gas outlet 6 via the outside gas passage 5 from the outside gas supply unit 50 by 500 sccm, and supplying a high-frequency power of 150 W as one example from the high-frequency power source 18 to the electrode 14 with the plasma maintained, a microplasma is formed, and fluorine radicals as one example of generated activated particles are applied to a second minute portion 20 for 30 seconds as one example. The second minute portion 20 is a region narrower than the first minute portion 119, and its line width is 0.3 mm as one example.

As a result of carrying out the processing as described above, the minute portion on the surface of the silicon thin plate 17 as one example of the object to be processed can be subjected to the fine line etching process of a line width of 0.3 mm. The etching depth is 21 μm. The reason of the nonoccurrence of arc discharge (spark) is considered to be ascribed to the reason described in connection with the first embodiment of the present invention.

In the fourth embodiment, the natural oxide film can be removed more promptly by using the reducing gas in the first step. It is to be noted that the reducing gas may be mixed with He supplied from the outside gas passage 5.

The area of the second minute portion 20 preferably is about 1/1000 to 1/5 of the area of the first minute portion 119. The area more preferably is 1/1000 to 1/10. If the area of the second minute portion 20 is extremely smaller than (i.e. less than 1/1000 of) the area of the first minute portion 119, then a large portion of the electric power in the first step becomes wasteful to a disadvantage. Moreover, only with the arrangement that the area of the second minute portion 20 is slightly smaller than (i.e. less than 1/1 and more than 1/5 of) the area of the first minute portion 119, the occurrence of arc discharge cannot sufficiently be restrained.

Fifth Embodiment

The fifth embodiment of the present invention will be described next with reference to FIGS. 1A through 3. It is to be noted that the basic construction and operation of the microplasma source shown in FIGS. 1A through 3 have been described in connection with the first embodiment, no detail is herein provided therefor.

First of all, in the first step, by supplying He as one example of inert gas and hydrogen ($H_2$) as one example of reducing gas by one sccm from the inner gas outlet 8 via the inside gas passage 7 from the inside gas supply unit 51 by 1000 sccm, supplying no gas from the outside gas passage 5 from the outside gas supply unit 50, and supplying a high-frequency power of 150 W as one example from the high-frequency power source 18 to the electrode 14, a microplasma is generated, and helium ions and hydrogen radicals as one example of generated activated particles are applied to a first minute portion 119 for two seconds as one example.

Next, in the second step, by supplying He as one example of inert gas from the inner gas outlet 8 via the inside gas passage 7 from the inside gas supply unit 51 by 1000 sccm, supplying $SF_6$ as one example of etching gas from the outer gas outlet 6 via the outside gas passage 5 from the outside gas supply unit 50 by 500 sccm, and supplying a high-frequency power of 150 W as one example from the high-frequency power source 18 to the electrode 14 with the plasma maintained, a microplasma is formed, and fluorine radicals as one example of generated activated particles are applied to a second minute portion 20 for 30 seconds as one example. The second minute portion 20 is a region narrower than the first minute portion 119, and its line width is 0.3 mm as one example.

As a result of carrying out the processing as described above, the minute portion on the surface of the silicon thin plate 17 as one example of the object to be processed can be subjected to the fine line etching process of a line width of 0.3 mm. The etching depth is 21 μm. The reason of the nonoccurrence of arc discharge (spark) is considered to be ascribed to the reason described in connection with the first embodiment of the present invention. In this fifth embodiment, the natural oxide film can be removed more promptly by using the reducing gas in the first step.

The area of the second minute portion 20 preferably is about 1/1000 to 1/5 of the area of the first minute portion 119. The area more preferably is 1/1000 to 1/10. If the area of the second minute portion 20 is extremely smaller than (i.e. less than 1/1000 of) the area of the first minute portion 119, then a large portion of the electric power in the first step becomes wasteful to a disadvantage. Moreover, only with the arrangement that the area of the second minute portion 20 is slightly smaller than (i.e. less than 1/1 and more than 1/5 of) the area of the first minute portion 119, the occurrence of arc discharge cannot sufficiently be restrained.

Sixth Embodiment

The sixth embodiment of the present invention will be described next with reference to FIGS. 1A through 3. It is to be noted that the basic construction and operation of the microplasma source shown in FIGS. 1A through 3 have been described in connection with the first embodiment, no detail is herein provided therefor.

First of all, in the first step, by supplying He as one example of inert gas and hydrogen ($H_2$) as one example of reducing gas by one sccm from the inner gas outlet 8 via the inside gas passage 7 from the inside gas supply unit 51 by 1000 sccm, supplying $SF_6$ as one example of etching gas from the outside gas passage 5 from the outside gas supply unit 50 by 50 sccm, and supplying a high-frequency power of 150 W as one example from the high-frequency power source 18 to the electrode 14, a microplasma is generated, and helium ions and hydrogen radicals as one example of generated activated particles are applied to a first minute portion for two seconds as one example.

Next, in the second step, by supplying He as one example of inert gas from the inner gas outlet 8 via the inside gas passage 7 from the inside gas supply unit 51 by 1000 sccm, supplying $SF_6$ as one example of etching gas from the outer gas outlet 6 via the outside gas passage 5 from the outside gas supply unit 50 by 500 sccm, and supplying a high-frequency power of 150 W as one example from the high-frequency power source 18 to the electrode 14 with the plasma maintained, a microplasma is formed, and fluorine radicals as one example of generated activated particles are applied to a second minute portion 20 for 30 seconds as one example. The second minute portion 20 is a region narrower than the first minute portion 119, and its line width is 0.3 mm as one example.

As a result of carrying out the processing as described above, the minute portion on the surface of the silicon thin plate 17 as one example of the object to be processed was able to be subjected to the fine line etching process of a line width of 0.3 mm. The etching depth was 21 μm. The reason of the nonoccurrence of arc discharge (spark) is considered to be ascribed to the reason described in connection with the first embodiment of the present invention. In the present embodiment, the natural oxide film can be removed more promptly by using the reducing gas in the first step.

In the present embodiment, the quantity of the etching gas issued from the outer gas outlet in the first step is made extremely smaller than in the second step, by which the region where the microplasma is generated in the first step is widened. The etching gas issued from the outer gas outlet in the first step preferably is 1/100 to 1/5 and more preferably is 1/100 to 1/10 of the etching gas issued from the outer gas outlet in the second step. If the etching gas issued from the outer gas outlet in the first step is made extremely smaller than in (i.e. less than 1/100 of) the second step, then it disadvantageously becomes difficult to control the gas flow rate by using an identical gas flow rate adjustment unit. Moreover, if the etching gas issued from the outer gas outlet in the first step is made slightly smaller than in (i.e. less than 1/1 and more than 1/5 of) the second step, the spreading of the plasma in the first step becomes insufficient, and there is a concern about the occurrence of arc discharge.

The area of the second minute portion preferably is about 1/1000 to 1/5 of the area of the first minute portion. The area more preferably is 1/1000 to 1/10. If the area of the second minute portion is extremely smaller than (i.e. less than 1/1000 of) the area of the first minute portion, then a large portion of the electric power in the first step becomes wasteful to a disadvantage. Moreover, only with the arrangement that the area of the second minute portion is slightly smaller than (i.e. less than 1/1 and more than 1/5 of) the area of the first minute portion, the occurrence of arc discharge cannot sufficiently be restrained.

Seventh Embodiment

The seventh embodiment of the present invention will be described next with reference to FIGS. 1A through 3. It is to be noted that the basic construction and operation of the microplasma source shown in FIGS. 1A through 3 have been described in connection with the first embodiment, no detail is herein provided therefor.

First of all, in the first step, by supplying He as one example of inert gas from the inner gas outlet 8 via the inside gas passage 7 from the inside gas supply unit 51 by 1000 sccm, supplying $SF_6$ as one example of reactive gas from the outer gas outlet 6 via the outside gas passage 5 from the outside gas supply unit 50 by 500 sccm, and supplying a high-frequency power of 60 W as one example from the high-frequency power source 18 to the electrode 14, a microplasma 118 is generated, and fluorine radicals as one example of generated activated particles are applied to a minute portion for three seconds as one example.

Next, in the second step, by supplying He as one example of inert gas from the inner gas outlet 8 via the inside gas passage 7 from the inside gas supply unit 51 by 1000 sccm, supplying $SF_6$ as one example of reactive gas from the outer gas outlet 6 via the outside gas passage 5 from the outside gas supply unit 50 by 500 sccm, and supplying a high-frequency power of 150 W as one example, which is one-and-a-half or more times greater than in the first step, from the high-frequency power source 18 to the electrode 14 with the plasma 118 maintained, the microplasma is formed, and fluorine radicals as one example of the generated activated particles are applied to a minute portion for 30 seconds as one example. In this case, the minute portion has a line width of 0.3 mm as one example.

As a result of carrying out the processing as described above, the minute portion on the surface of the silicon thin plate 17 as one example of the object to be processed is able to be subjected to the fine line etching process of a line width of 0.3 mm. The etching depth is 24 μm. The reason of the nonoccurrence of arc discharge (spark) is considered to be ascribed to the fact that the natural oxide film on the surface of the silicon thin plate is first removed by the plasma generated by the small electric power such that no arc discharge occurs in the first step.

That is, in the seventh embodiment, it is presumed that the effect is produced by the processing carried out dividedly in the step of supplying a first electric power to the electrode and the step of supplying a second electric power greater than the first electric power to the electrode.

Figure 8:
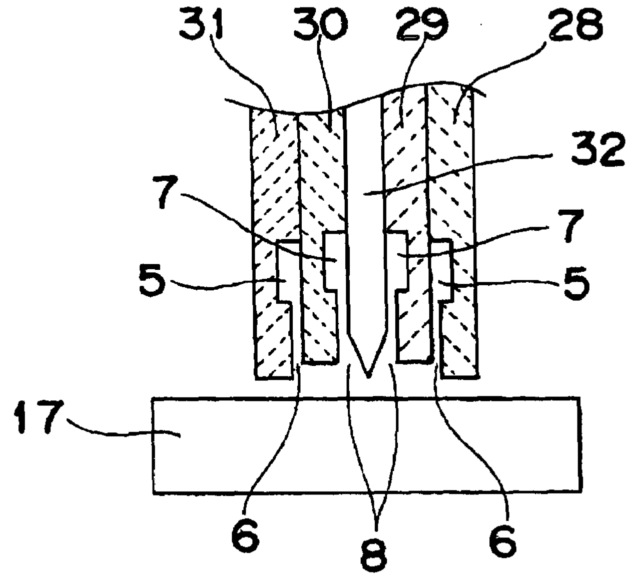
FIG. 8 is a sectional view of a microplasma source used by a plasma processing method of another embodiment of the present invention.
Figure 9A:
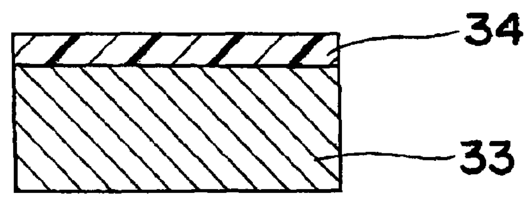
FIG. 9A is a sectional view showing a process of a resist process used in a prior art example.
Figure 9B:
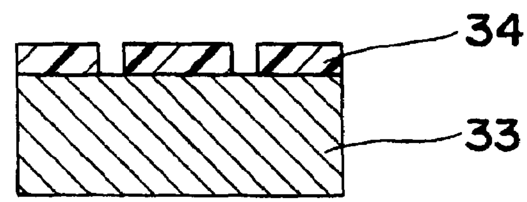
FIG. 9B is a sectional view showing a process of the resist process used in the prior art example.
Figure 9C:
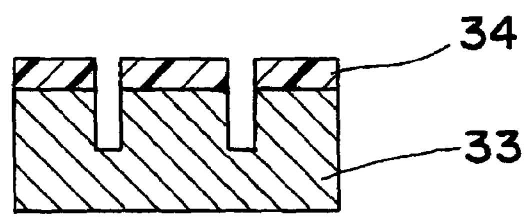
FIG. 9C is a sectional view showing a process of the resist process used in the prior art example.
Figure 9D:
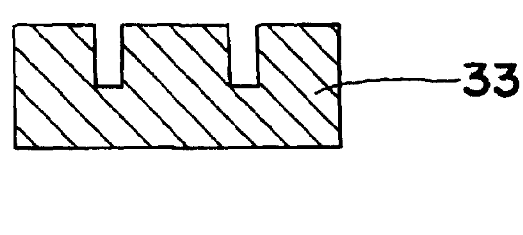
FIG. 9D is a sectional view showing a process of the resist process used in the prior art example.

In connection with the first through seventh embodiments of the present invention described above, there has been exemplified the case where the four ceramic plates are employed as the microplasma source. However, it is possible to employ a variety of microplasma sources such as the capillary types of a parallel plate type capillary type, an inductive coupling type capillary type and so on, a microgap system, and an inductive coupling type tube type. In particular, in the type that employs a knife-edge-shaped electrode 32 as shown in FIG. 8, since the distance between the electrode and the object to be processed is short, a plasma of an extremely high density is formed in the minute portion. Therefore, the present invention is especially effective.

In FIG. 8, the microplasma source is constructed of the outside plate 28, the inside plates 29 and 30, the outside plate 31, which are made of ceramics, and the electrode 32. The outside plates 28 and 31 are provided with the outside gas passage 5 and the outer gas outlet 6, while the inside plates 29 and 30 are provided with the inside gas passage 7 and the inner gas outlet 8. The electrode 32 has the knife-edge-shaped lowermost portion and is able to effect plasma processing in a minute linear region.

Moreover, by supplying a dc voltage or a high-frequency power to the object to be processed, it is also possible to strengthen the action of drawing in the ions in the microplasma. In this case, the electrode may be grounded, and the application of the present invention is also possible when a microplasma source of a type that employs no electrode is utilized.

Although there has been exemplified the case of the microplasma generated by using the high-frequency power, it is possible to generate the microplasma by using a high-frequency power of a frequency ranging from several hundred kilohertz to several gigahertz. Otherwise, it is possible to use a dc power or supply a pulse power.

Moreover, although it has been exemplified the case where the thickness of the fine line that constitutes the opening of the microplasma source is 0.1 mm, the width of the opening of the plasma source is not limited to this and preferably is not smaller than about 10 μm and not greater than about 1 mm. There is an advantage that it becomes difficult for the activated particles generated by the plasma to come in contact with the outside of the fine line portion of the substrate surface as the width of the opening of the microplasma source is smaller, and only the region limited to the fine line portion can be processed. On the other hand, taking the processing accuracy of the components that constitute the microplasma source, a change in shape with a lapse of time due to repetitive processing and so on into consideration, the width preferably avoid being extremely reduced.

Moreover, the distance between the opening of the microplasma source and the object to be processed preferably is not greater than about 1 mm. Furthermore, the distance between the opening of the microplasma source and the object to be processed more preferably is not greater than about 0.5 mm. There is an advantage that it becomes difficult for the activated particles generated by the plasma to come in contact with the outside of the fine line portion of the substrate surface as the distance between the opening of the microplasma source and the object to be processed is smaller, and only the region limited to the fine line portion can be processed. On the other hand, taking the processing accuracy of the components that constitute the microplasma source, a change in shape with a lapse of time due to repetitive processing as well as the reproducibility, the stability, and so on of the distance between the opening of the microplasma source and the object to be processed into consideration, the distance preferably avoid being extremely reduced and preferably is not smaller than about 0.05 mm.

Figure 14:
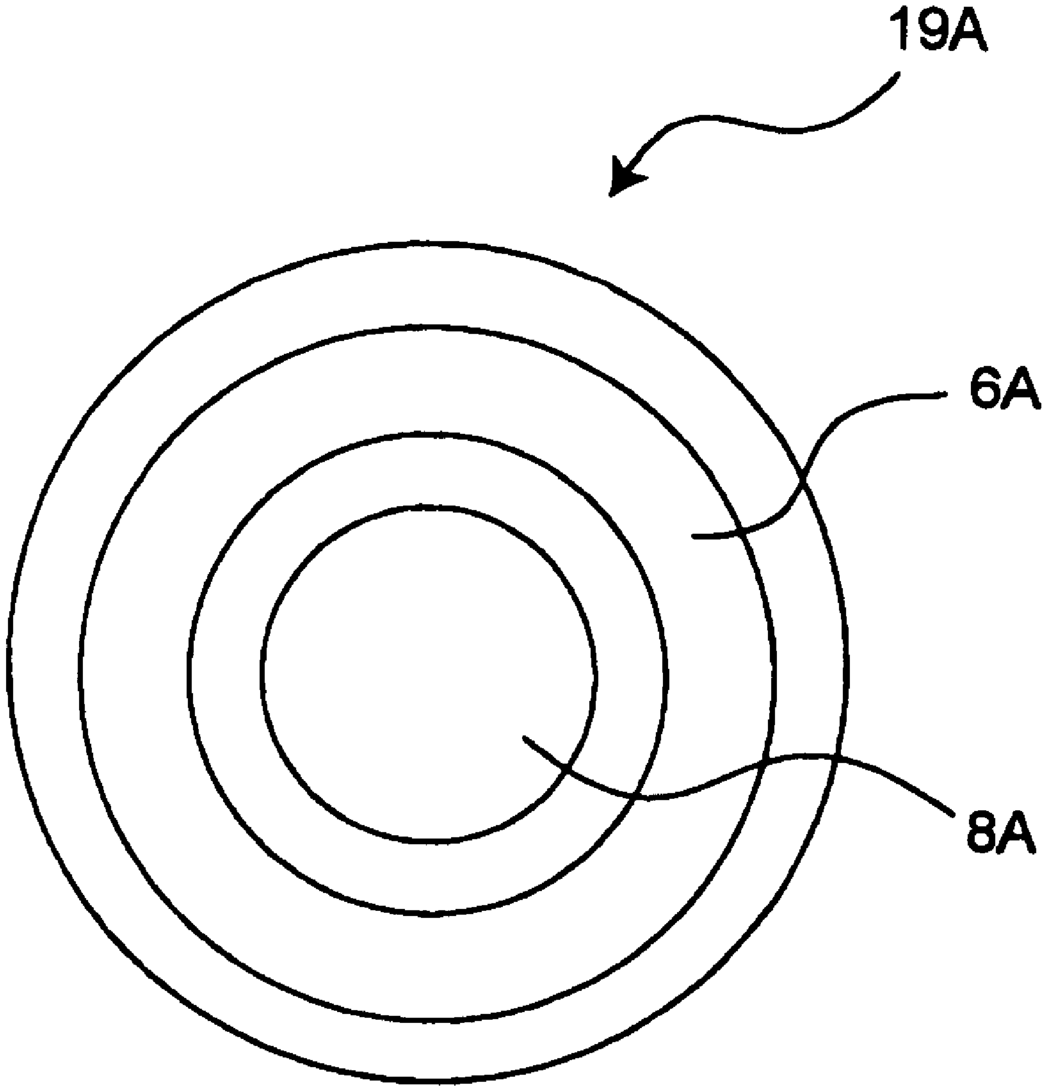
FIG. 14 is a bottom view showing an example of a microplasma source constructed in a double cylinder shape used by the plasma processing method of another embodiment of the present invention.
Figure 15:
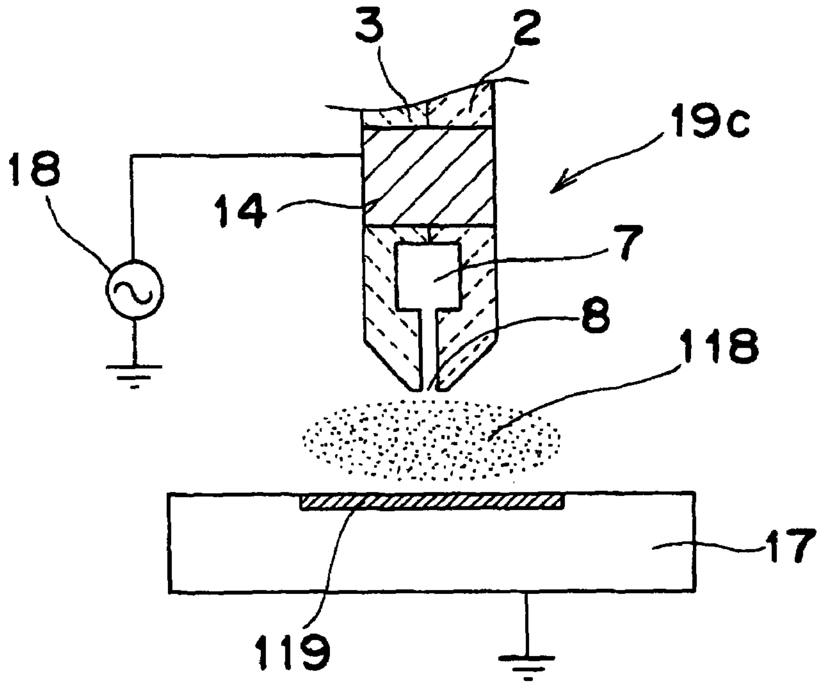
FIGS. 15, 16, 17, and 18 are sectional views and perspective views of a cylindrical microplasma source used by the plasma processing method of another embodiment of the present invention, showing a state in which a first step and a second step are carried out in the case where only one gas outlet is provided.
Figure 16:
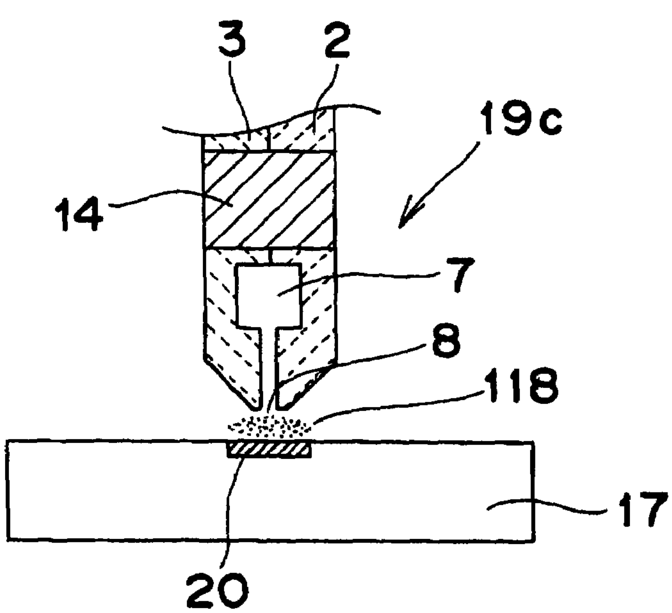
Figure 17:
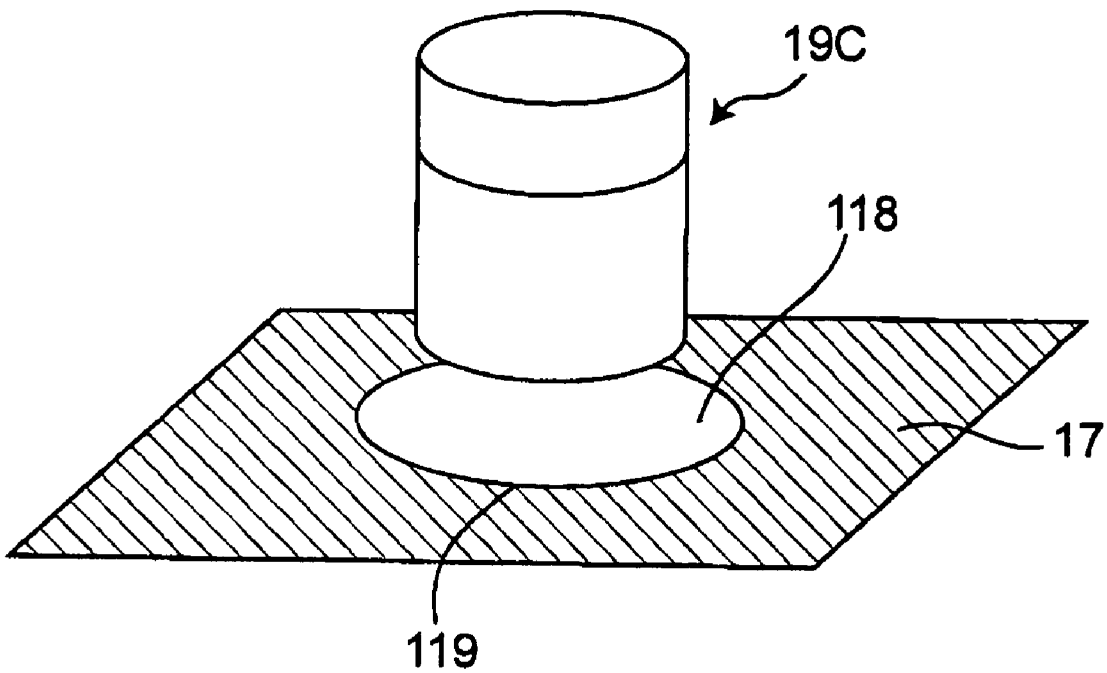
Figure 18:
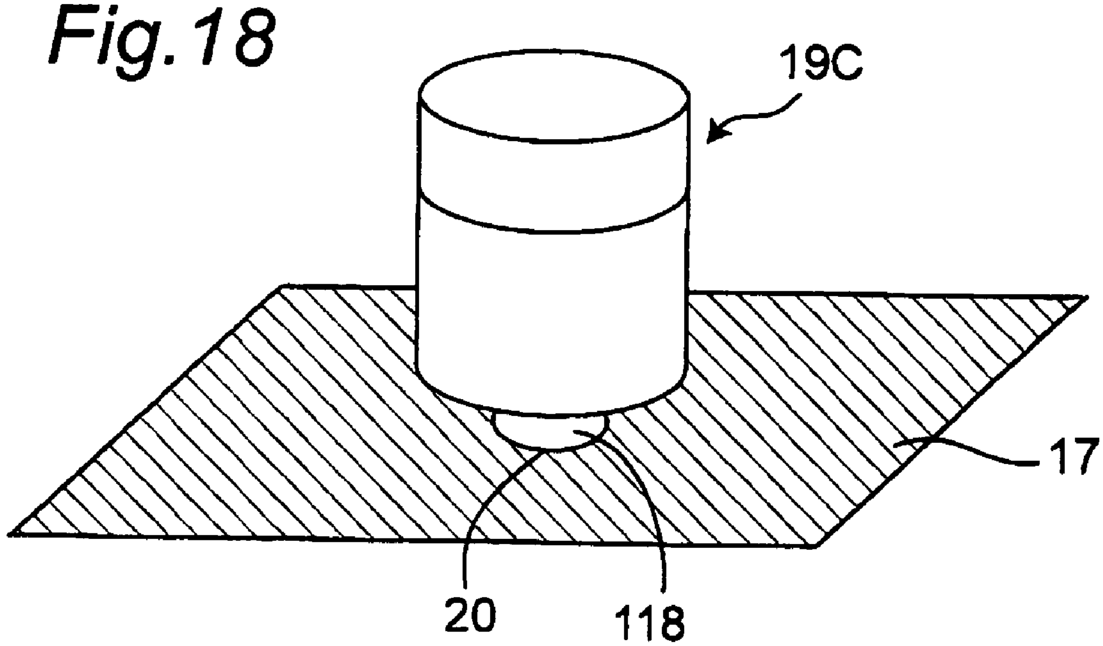

Moreover, although there has been exemplified the case where the opening of the microplasma source forms a fine line shape, it is acceptable to provide a double cylinder shape such that an inner gas outlet 8A of the opening of a microplasma source 19A has a minute dotted shape or a circular shape and an outer gas outlet 6A has a ring-like shape or a circular arc shape, as shown in FIG. 14. In this case, the present invention is especially effective when the representative dimension of the inside diameter of the inner gas outlet 8A of the opening of the microplasma source 19A is not greater than 1 mm.

Moreover, although there has been exemplified the case where the silicon thin plate is employed as the object to be processed, the object to be processed is not limited to this. The present invention produces an exceptional effect when an object to be processed having an electrical conductivity or, in particular, metal is processed.

Moreover, although there has been exemplified the case where the time during which the first step is effected is set to two to five seconds, the time during which the first step is effected preferably is properly determined according to the material of the object to be processed. However, if the first step is effected for an excessively long time, it is sometimes the case where undesirable situations of a change in quality, deformation, and so on of the object to be processed might occur due to a rise in the temperature of the entire object to be processed, and therefore, the time is limited to about 1 to 10 seconds.

Moreover, although there has been exemplified the case where He is used as inert gas, $SF_6$ is used as reactive and etching gases, and $H_2$ is used as reducing gas, it is needless to say that gases other than these can be properly used. For example, it is possible to use He, Ne, Ar, Kr, Xe, and so on as inert gas, use $C_xF_y$ (x and y are natural numbers) of $SF_6$ and $CF_4$, and so on and halogen containing gases of $NF_3$, $Cl_2$, HBr, and so on as reactive and etching gases, and use hydrogen containing gases of $H_2$, $H_2O$, and so on as reducing gas.

Moreover, by changing the distance between the microplasma source and the substrate to be processed in the first step and the second step, effects and operation similar to those of the aforementioned embodiments can be produced even if the gas type is not changed.

That is, in the first step, by setting the distance between the inner gas outlet 8 of the microplasma source 19 and the silicon thin plate 17 to 1 mm, supplying He as inert gas from the inner gas outlet 8 via the inside gas passage 7 by 1000 sccm, supplying $SF_6$ as reactive gas from the outer gas outlet 6 via the outside gas passage 5 by 500 sccm, and supplying a high-frequency power of 150 W to the electrode 14, a microplasma 118 is generated, and fluorine radicals as generated activated particles are applied to a first minute portion 119 for five seconds.

Next, in the second step, it is possible to move down the microplasma source 19 by means of the elevation unit 150 shown in FIG. 1C, set the distance between the inner gas outlet 8 of the microplasma source 19 and the silicon thin plate 17 to 0.3 mm, supply He as inert gas from the inner gas outlet 8 via the inside gas passage 7 by 1000 sccm, supply $SF_6$ as reactive gas from the outer gas outlet 6 via the outside gas passage 5 by 500 sccm, and supply a high-frequency power of 150 W to the electrode 14 with the plasma 118 maintained for the formation of the microplasma 118 and apply fluorine radicals as generated activated particles to the second minute portion 20 for 30 seconds.

When carrying out the processing as described above, the minute portion of the surface of the silicon thin plate 17 as one example of the object to be processed can be subjected to the etching process of a fine line of a line width of 0.3 mm. The etching depth is 21 μm.

Otherwise, a similar effect can be obtained without changing the gas type by making the distance between the gas outlet 8 and the silicon thin plate 17 in the first step greater than the distance between the gas outlet 8 and the silicon thin plate 17 in the second step also in the case of a cylindrical microplasma source 19C, as shown in FIGS. 15, 16, 17, and 18, which has only one gas outlet (for example, in the case of only the inner gas outlet 8).

By properly combining the arbitrary embodiments of the aforementioned various embodiments, the effects possessed by the embodiments can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method for processing a surface of an object to be processed made of a metal or a semiconductor by applying activated particles generated by a microplasma generated at a pressure of not lower than 10,000 Pa and not higher than three atmospheric pressures to the surface of the object, the method comprising:

removing a natural oxide film on the surface of the object; and etching a part or whole of a region in which the natural oxide film has been removed.

2. The plasma processing method as claimed in claim 1, wherein the microplasma is generated by supplying an electric power to an electrode provided at a microplasma source arranged in a neighborhood of the object or the object while supplying gas to the microplasma source when carrying out the film removing and the region processing, and the generated activated particles are made to act on the object so as to process the surface of the object, the natural oxide film is removed by applying the activated particles to a first portion of the surface of the object in the film removing, and an etching is carried out by applying activated particles to a second portion that is included in the first portion of the surface of the object and is narrower than the first portion in the region processing.

3. The plasma processing method as claimed in claim 2, wherein with the microplasma source having an inner gas outlet and an outer gas outlet, gas mainly comprised of inert gas is issued from the inner gas outlet and gas mainly comprised of inert gas is issued from the outer gas outlet in applying the activated particles to the first portion, and gas mainly comprised of inert gas is issued from the inner gas outlet and gas mainly comprised of reactive gas is issued from the outer gas outlet in applying the activated particles to the second portion.

4. The plasma processing method as claimed in claim 2, wherein with the microplasma source having an inner gas outlet and an outer gas outlet, gas mainly comprised of inert gas is issued from the inner gas outlet and no gas is issued from the outer gas outlet in applying the activated particles to the first portion, and gas mainly comprised of inert gas is issued from the inner gas outlet and gas mainly comprised of reactive gas is issued from the outer gas outlet in applying the activated particles to the second portion.

5. The plasma processing method as claimed in claim 2, wherein with the microplasma source having an inner gas outlet and an outer gas outlet, gas mainly comprised of inert gas is issued from the inner gas outlet and gas mainly comprised of reactive gas is issued from the outer gas outlet in applying the activated particles to the first portion, and gas mainly comprised of inert gas is issued from the inner gas outlet and gas mainly comprised of reactive gas is issued from the outer gas outlet in applying the activated particles to the second portion by a quantity several times to several tens of times larger than in applying the activated particles to the first portion.

6. The plasma processing method as claimed in claim 1, wherein the microplasma is generated by supplying an electric power to an electrode provided at a microplasma source arranged in a neighborhood of the object or the object while supplying gas to the microplasma source when carrying out the film removing and the region processing, and the generated activated particles are made act on the object so as to process the surface of the object, the natural oxide film is removed by applying activated particles that have reducibility, to the surface of the object in the film removing, and an etching is carried out by applying in the region processing activated particles that have etchability, to the surface of the object to which the activated particles that have reducibility have been applied, in the region processing.

7. The plasma processing method as claimed in claim 6, wherein the activated particles are applied to the first portion of the surface of the object in the film removing, and the activated particles are applies to a second portion that is included in the first portion and is narrower than the first portion in the region processing.

8. The plasma processing method as claimed in claim 7, wherein with the microplasma source having an inner gas outlet and an outer gas outlet, gas mainly comprised of inert gas is issued from the inner gas outlet and gas mainly comprised of inert gas is issued from the outer gas outlet while reducing gas is mixed with the gas issued from the inner gas outlet or the outer gas outlet, in applying the activated particles to the first portion, and gas mainly comprised of inert gas is issued from the inner gas outlet and gas mainly comprised of etching gas is issued from the outer gas outlet in applying the activated particles to the second portion.

9. The plasma processing method as claimed in claim 7, wherein with the microplasma source having an inner gas outlet and an outer gas outlet, a mixed gas of inert gas and reducing gas is issued from the inner gas outlet and no gas is issued from the outer gas outlet in applying the activated particles to the first portion, and gas mainly comprised of inert gas is issued from the inner gas outlet and gas mainly comprised of etching gas is issued from the outer gas outlet in applying the activated particles to the second portion.

10. The plasma processing method as claimed in claim 7, wherein with the microplasma source having an inner gas outlet and an outer gas outlet, a mixed gas of inert gas and reducing gas is issued from the inner gas outlet and gas mainly comprised of etching gas is issued from the outer gas outlet in applying the activated particles to the first portion, and gas mainly comprised of inert gas is issued from the inner gas outlet, and gas mainly comprised of etching gas is issued from the outer gas outlet by a quantity larger than in applying the activated particles to the first portion, in applying the activated particles to the second portion.

11. The plasma processing method as claimed in claim 1, wherein the microplasma is generated by supplying an electric power to an electrode provided at a microplasma source arranged in a neighborhood of the object or the object while supplying gas to the microplasma source when carrying out the film removing and the region processing and making the generated activated particles act on the object so as to process the surface of the object, the method comprising:

the natural oxide film on the surface of the object is removed by supplying a first electric power to the electrode provided at the microplasma source or the object in the film removing; and the part or whole of the region in which the natural oxide film on the surface of the object has been removed is etched by supplying a second electric power that is greater than the first electric power to the electrode provided at the microplasma source or the object in the region processing.

* * * * *